(12) United States Patent
Takemura et al.

(10) Patent No.: US 8,810,039 B2
(45) Date of Patent: Aug. 19, 2014

(54) SEMICONDUCTOR DEVICE HAVING A PAD AND PLURALITY OF INTERCONNECTS

(75) Inventors: Koji Takemura, Osaka (JP); Hiroshige Hirano, Nara (JP); Masao Takahashi, Kyoto (JP); Hikari Sano, Hyogo (JP); Yutaka Itoh, Kyoto (JP); Koji Koike, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/323,454

(22) Filed: Dec. 12, 2011

(65) Prior Publication Data
US 2012/0080780 A1 Apr. 5, 2012

Related U.S. Application Data

(62) Division of application No. 11/511,306, filed on Aug. 29, 2006, now Pat. No. 8,102,056.

(30) Foreign Application Priority Data

Sep. 2, 2005 (JP) ................. 2005-254852

(51) Int. Cl.
*H01L 23/48* (2006.01)
*H01L 23/00* (2006.01)
*H01L 21/66* (2006.01)

(52) U.S. Cl.
CPC ............... *H01L 24/05* (2013.01); *H01L 22/32* (2013.01); *H01L 2224/05094* (2013.01)
USPC .......................................... 257/774; 257/758

(58) Field of Classification Search
CPC .............. H01L 22/32; H01L 24/05; H01L 2224/02166; H01L 2224/05093; H01L 2224/05094; H01L 2224/05095; H01L 2224/05556
USPC ................................................. 257/758, 774
See application file for complete search history.

(56) References Cited

U.S. PATENT DOCUMENTS

| 5,514,892 A | 5/1996 | Countryman et al. |
| 5,739,587 A | 4/1998 | Sato |
| 5,751,065 A | 5/1998 | Chittipeddi et al. |
| 6,232,662 B1 | 5/2001 | Saran |
| 6,383,916 B1 | 5/2002 | Lin |

(Continued)

FOREIGN PATENT DOCUMENTS

| JP | 08-293523 | 11/1996 |
| JP | 11-168101 | 6/1999 |

(Continued)

OTHER PUBLICATIONS

United States Notice of Allowance issued in U.S. Appl. No. 11/511,306 mailed Oct. 6, 2011.

(Continued)

*Primary Examiner* — Ori Nadav
(74) *Attorney, Agent, or Firm* — McDermott Will & Emery LLP

(57) ABSTRACT

A semiconductor device includes: a semiconductor substrate; a first interlayer insulating film formed over the semiconductor substrate; a pad formed above the first interlayer insulating film; and a plurality of first interconnects spaced apart from each other in a portion of the first interlayer insulating film located below the pad. Below the pad, the first interconnects are formed in quadrangular plan shapes.

30 Claims, 15 Drawing Sheets

(56) References Cited

U.S. PATENT DOCUMENTS

| | | |
|---|---|---|
| 6,417,575 B2 | 7/2002 | Harada et al. |
| 6,448,641 B2 | 9/2002 | Ker et al. |
| 6,552,438 B2 * | 4/2003 | Lee et al. .................. 257/784 |
| 6,555,922 B1 | 4/2003 | Nakagawa |
| 6,633,087 B2 | 10/2003 | Ker et al. |
| 6,737,748 B2 | 5/2004 | Bauch et al. |
| 6,858,885 B2 | 2/2005 | Ebara |
| 7,038,280 B2 | 5/2006 | Righter |
| 7,247,552 B2 | 7/2007 | Pozder et al. |
| 2002/0179991 A1 | 12/2002 | Varrot et al. |
| 2004/0070042 A1 | 4/2004 | Lee et al. |
| 2006/0157740 A1 | 7/2006 | Nonoyama et al. |

FOREIGN PATENT DOCUMENTS

| | | |
|---|---|---|
| JP | 2000-252363 | 9/2000 |
| JP | 2001-176966 | 6/2001 |
| JP | 2001-351920 | 12/2001 |
| JP | 2002-16069 | 1/2002 |
| JP | 2002-324798 | 11/2002 |
| JP | 2003-289104 | 10/2003 |
| JP | 2003289104 A | 10/2003 |
| JP | 2004-311787 | 11/2004 |
| JP | 2005-050963 | 2/2005 |
| WO | WO 2004/093188 A1 | 10/2004 |

OTHER PUBLICATIONS

Shimoyama, N., et al. "Device degradation induced by stud bumping above the MOFSETs(3)" Extended Abstracts (The 45th Spring Meeting, 1988), The Japan Society of Applied Physics and Related Societies, vol. 3, p. 849.

* cited by examiner

000
SEMICONDUCTOR DEVICE HAVING A PAD AND PLURALITY OF INTERCONNECTS

CROSS-REFERENCE TO RELATED APPLICATIONS

This application is a Divisional of application Ser. No. 11/511,306, filed on Aug. 29, 2006, which claims priority under 35 U.S.C. §119 on Patent Application No. 2005-254852 filed in Japan on Sep. 2, 2005, the entire contents of which are hereby incorporated by reference.

BACKGROUND OF THE INVENTION (a) Fields of the Invention

The present invention relates to semiconductor devices including pads.

(b) Description of Related Art

With the aim of reducing chip size, various types of semiconductor device structures are proposed which each have a bonding pad arranged on an element formation region of an input/output (I/O) cell.

However, when the pad is formed on an element, impact load applied by wire bonding to the pad may cause damages to an interconnect or an interlayer insulating film immediately below the pad. In addition, the impact load may degrade operating characteristics of a diffusion element such as a transistor formed immediately below the pad.

For example, wire bonding employing gold ball bonding is conducted by the following process: while a chip is heated to 230 to 240° C. and a predetermined load is applied to a gold ball, ultrasonic wave is applied to break an oxide film on the surface of an aluminum pad, thereby forming an alloy of gold and aluminum between an aluminum intrinsic surface and a gold interface. By this process, energy of ultrasonic wave applied through the gold ball to the pad during the wire bonding generates stress at the interface between an interlayer insulating film and a metal below the pad, which in turn creates cracks in the interlayer insulating film made of $SiO_2$ or the like. Also, it is known that by this process, the characteristics of a transistor (Vt, Gm, lifetime of a hot carrier, and the like) formed immediately below the pad are degraded (see, for example, Extended Abstracts (The 45th Spring Meeting, 1998), The Japan Society of Applied Physics and Related Societies, Vol. 3, p. 849).

Moreover, for a cantilever-type probe testing, which is a general approach of a probe testing, a needle of tungsten or the like is pressed against the pad. Thus, a large concentrated load is applied to a portion immediately below the pad, which may cause cracks into the interlayer insulating film.

In order to reduce such damages caused by bonding, probe testing, and the like, the structure as shown below (see, for example, U.S. Pat. No. 5,751,065) is disclosed.

FIG. 21 shows a cross-sectional structure of a semiconductor device according to a conventional example, and FIG. 22 shows a plan structure of a metal layer 215 in FIG. 21. Referring to FIGS. 21 and 22, dielectric layers 213 and 217 are formed over a substrate 201 having an active device 203 provided thereon, and a pad 219 is formed on the dielectric layer 217.

The patterned metal layer 215 is formed in a portion of the dielectric layer 217 located below the pad 219. The metal layer 215 formed immediately below the pad protects the active device from stress generated by a bonding process.

SUMMARY OF THE INVENTION

By such a conventional electrode pad, influences of impact load due to wire bonding to the pad and of concentrated load due to probing can be prevented to some extent from being exerted on elements such as transistors or the like. However, the metal layer provided below the pad disadvantageously generates new stress to create cracks in the interlayer insulating film and degrade electrical characteristics of the element.

In the conventional semiconductor structure, a metal layer provided closest to the pad is formed in a comb-like plan shape. Therefore, the metal layer has almost the same vertical and horizontal lengths as the pad size, so that during a semiconductor fabrication process, thermal shrinkage of the metal layer formed in a comb-like plan shape generates large stress. The generated stress promotes stress generated by the bonding process and probing process, which becomes a cause of cracks in the interlayer insulating film.

Furthermore, in the conventional semiconductor structure, since the metal layer is formed in a comb-like plan shape, a plurality of apexes with internal angles of about 270 degrees are present at portions thereof corresponding to the bases of the comb teeth. Disadvantageously, large stress is generated at these apexes with great internal angles, and the generated stress in turn applies stress to the interlayer insulating film.

Both of the stress generated in bonding or the like and the stress generated by the metal layer remain even after resin sealing and resin curing for protecting connection portions, which greatly degrades the reliability of the semiconductor device.

An object of the present invention is to solve the conventional problems mentioned above and to provide a highly reliable semiconductor device which protects elements from stress generated in a bonding process and a probing process and which eliminates cracks to be created in an interlayer insulating film lying below a bonding pad.

To attain the above object, the present invention is designed so that a semiconductor device includes a plurality of interconnects formed in quadrangular plan shapes and spaced apart from each other below a pad.

To be more specific, a semiconductor device according to the present invention is characterized by comprising: a semiconductor substrate; a first interlayer insulating film formed over the semiconductor substrate; a pad formed above the first interlayer insulating film; and a plurality of first interconnects which have quadrangular plan shapes and which are spaced apart from one another in a portion of the first interlayer insulating film located at least below the pad.

With the semiconductor device of the present invention, the first interconnects can relieve stress applied to the pad. Moreover, since the first interconnects below the pad are formed to have quadrangular plan shapes, they have no apex with an internal angle beyond 180 degrees that will generate large stress. With this structure, stress generated by the first interconnect can be reduced. Therefore, the first interconnects can disperse stress applied from outside during a bonding process and a probing process. Simultaneously with this, stress generated by the first interconnects can be suppressed to a small magnitude to prevent creation of cracks in an interlayer insulating film and the like below the pad.

Preferably, in the semiconductor device of the present invention, each of the first interconnects has two pairs of opposite sides with at least one pair having a smaller length than the width of the pad. With this structure, a plurality of first interconnects having smaller widths than the pad can be arranged below the pad, and thereby stress can be dispersed and relieved effectively.

Preferably, in the semiconductor device of the present invention, in a region below the pad, the area occupied by the plurality of first interconnects is 30% or more of the area of the pad. With this structure, stress applied to the interlayer insulating film and an element can be reduced effectively.

Preferably, in the semiconductor device of the present invention, the plurality of first interconnects each extend linearly below the pad. With this structure, the apexes of each of the first interconnects have internal angles smaller than 180 degrees, so that the first interconnects can be formed which have no apex with a large internal angle to which large stress will be applied.

Preferably, in the semiconductor device of the present invention, the first interconnects extend in the same direction.

Preferably, in this case, the pad has a rectangular plan shape, and in a region below the pad, the first interconnects extend in the orthogonal direction to the longer side of the pad. Also, in a region below the pad, the first interconnects may extend in the parallel direction to the longer side of the pad. With this structure, the direction in which the first interconnects extend can be set to be parallel to the probing direction on the pad. Therefore, stress applied to the pad during probing can be relieved efficiently by the first interconnects. For example, if the probing direction is the same as the direction of extension of the first interconnects, a portion of the first interconnect extending in the probing direction has a substantially flat top portion. Therefore, during probing, the influence of steps made by a material underlying the pad can be eliminated to reduce creation of cracks in an interlayer insulating film and the like due to the probing. On the other hand, if the probing direction is orthogonal to the direction of extension of the first interconnects, a plurality of first interconnects are present in a region lying below the pad and in the probing direction. Thereby, steps existing between the first interconnects can be used to bring the probe into efficient contact with the pad. As a result, the probing weight can be decreased to suppress creation of cracks in the interlayer insulating film and the like.

Preferably, in the semiconductor device of the present invention, some of the plurality of first interconnects extend below the pad in a first direction, and the others of the plurality of first interconnects extend below the pad in a second direction orthogonal to the first direction. With this structure, stress can be dispersed.

Preferably, in this case, the pad has a rectangular plan shape, the first direction is the direction orthogonal to the shorter side of the pad, and the second direction is the direction parallel to the shorter side of the pad.

Preferably, in the semiconductor device of the present invention, the first interconnects are formed in insular shapes. This more effectively disperses and relieves stress concentration into the interlayer insulating film, and thereby creation of cracks can be suppressed.

Preferably, in the semiconductor device of the present invention, the first interconnects each have a plan shape with corners chamfered. With this structure, the first interconnects have no apex that will generate large stress, so that stress concentration caused at the corners can be reduced.

Preferably, the semiconductor device of the present invention further comprises at least one first via plug penetrating the first insulating film, and the first via plug electrically connects the pad to any one of the plurality of first interconnects. With this structure, stress applied to the pad in the perpendicular direction to the substrate can be dispersed by the via plug.

In this case, the first via plug is preferably formed to come into contact with the center portion of the pad, and it is preferable that the device includes a plurality of first via plugs and they are formed along a first interconnect of the plurality of first interconnects which extends below the center portion of the pad. In addition, the device may include a plurality of first via plugs, and they may be formed in a perimeter area of the pad and along one side of the pad. Preferably, in a region of the plurality of first interconnects located beside one said side, the plurality of first via plugs are in contact with a first interconnect thereof formed along one said side. With such a structure, stress applied in the perpendicular direction to the substrate can be effectively relieved.

Preferably, in the semiconductor device of the present invention, the first interconnects are formed to displace a side portion of the first interconnect from a side portion of the pad. Since both of the side portion (edge) of the first interconnect and the side portion (edge) of the pad are stress-concentrating portions, the structure with the portions not overlapping each other can prevent an increase in stress concentration.

Preferably, the semiconductor device of the present invention further comprises: a second interlayer insulating film formed between the substrate and the first interlayer insulating film; a plurality of second interconnects formed in the second interlayer insulating film; and a second via plug formed in a portion of the second interlayer insulating film located below the pad and electrically connecting any one of the plurality of first interconnects to any one of the plurality of second interconnects.

Preferably, in this case, some of the plurality of first interconnects serve as shielding signal lines for providing electrical shielding between the pad and the second interconnect. Preferably, the shielding signal lines are grounding signal lines or power-source signal lines. Use of some of the first interconnects also as shielding signal lines can provide an efficient layout.

Preferably, the semiconductor device of the present invention further comprises a third interlayer insulating film formed between the first interlayer insulating film and the pad, and a region of the third interlayer insulating film not underlying the pad is formed with a third interconnect.

Preferably, in the semiconductor device of the present invention, the pad is formed of a single layer film of metal, or multiple layers of metal films.

Preferably, in the semiconductor device of the present invention, at least two of the plurality of first interconnects are electrically connected to each other so that a connection interconnect formed in an interlayer insulating film different from the first interlayer insulating film is interposed therebetween.

DETAILED DESCRIPTION OF THE PREFERRED EMBODIMENTS

First Embodiment

Figure 1:
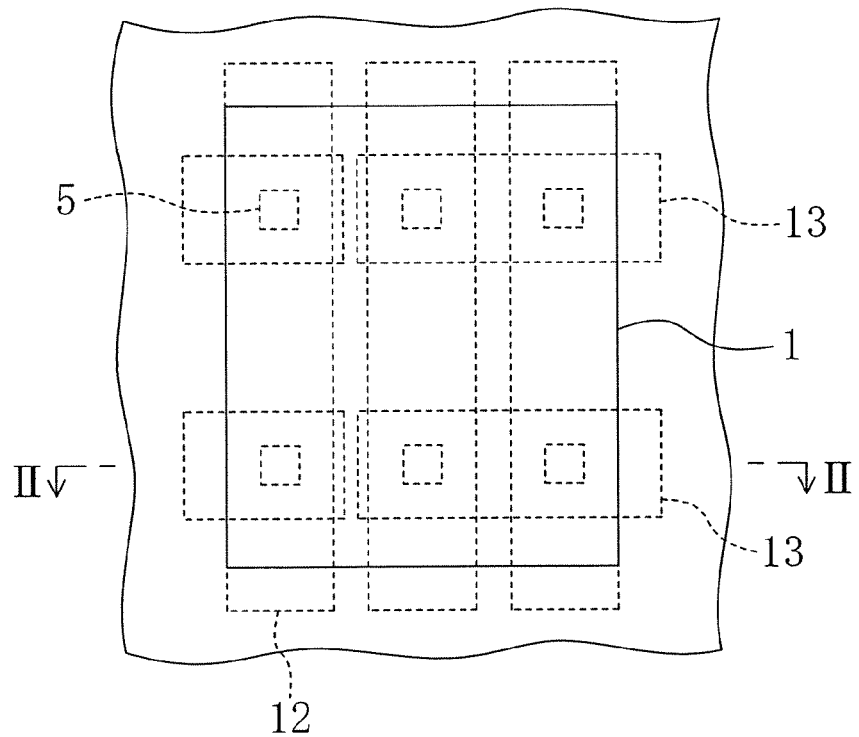
FIG. 1 is a plan view showing a semiconductor device according to a first embodiment of the present invention.
Figure 2:
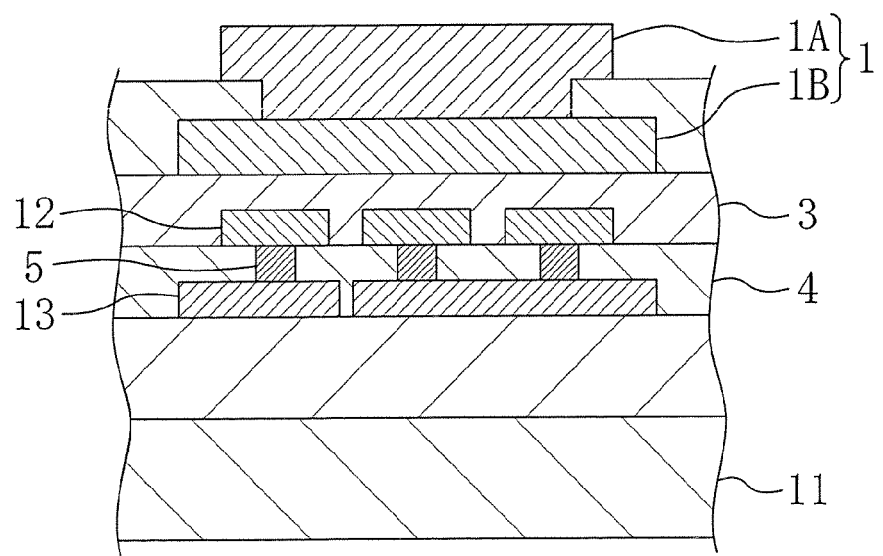
FIG. 2 is a sectional view showing the semiconductor device according to the first embodiment of the present invention.

A first embodiment of the present invention will be described with reference to the accompanying drawings. FIG. 1 shows a plan structure of a pad metal portion of a semiconductor device according to the first embodiment, and FIG. 2 shows a cross-sectional structure thereof taken along the line II-II in FIG. 1. FIGS. 1 and 2 show an exemplary structure in which two layers of interconnects are formed below a pad, and illustration of a diffusion layer and a transistor structure is omitted.

Referring to FIGS. 1 and 2, the semiconductor device of the first embodiment includes: multiple layers of interlayer insulating films formed over a semiconductor substrate 11; and a pad 1 formed above the interlayer insulating films.

The pad 1 is composed of a first pad metal 1A and a second pad metal 1B. Below the pad 1, a first interlayer insulating film 3 and a second interlayer insulating film 4 are formed which have interconnects buried therein, and a plurality of first interconnects 12 and a plurality of second interconnects 13 are buried in the first and second interlayer insulating films 3 and 4, respectively. A plurality of via contacts 5 are provided which electrically connect the first interconnects 12 to the second interconnects 13, respectively.

The first and second interconnects 12 and 13 can be used for power supply and signal supply to an input/output circuit, respectively. Some of the first interconnects 12 formed below the pad 1 may serve as shielding signal lines such as grounding signal lines or power-source signal lines or the like. With such usage, the first interconnect 12 can be used both as an interconnect for stress relief and a shielding line, which is effective in layout of the device. Also, such usage can provide the effect of having the structure in which signal noise at the pad has no influence on underlying signal lines of the elements and the like.

As shown in FIG. 1, the first interconnects 12 in the first embodiment are made of conductive films in rectangular plan shapes spaced apart from one another below the pad 1, and relieve stress applied to the pad 1. Below the pad 1, the first interconnects 12 are arranged linearly and have no bent or branched portion. No interconnect for electrically connecting the first interconnects 12 is provided in a portion of the first interlayer insulating film 3 located below the pad 1. That is to say, in the first interlayer insulating film 3, the first interconnects 12 are independent of one another. Note that the first interconnects 12 may be electrically connected so that a connection interconnect provided in an interlayer insulating film other than the first interlayer insulating film 3 is interposed therebetween. The second interconnect 13 may be used as a connection interconnect.

Below the pad 1, the first interconnects 12 are electrically connected to the second interconnects 13 with the via contacts 5 interposed therebetween, respectively. The via contacts 5 can reduce thermal shrinkage of the first interconnects 12 during a wafer process. For this effect, the sum of areas of the contact portions between the via contacts 5 and the first interconnects 12 is preferably 10% or more and 60% or less of the sum of the areas occupied by the first interconnects 12 in the region below the pad 1.

With such a structure, almost no stress or strain occurs in the first interlayer insulating film 3. Therefore, below the pad 1, the first interlayer insulating film 3 is free from stress, and thus it does not contribute to development of stress generated by the bonding process or the probing process and can prevent the occurrence of physical damages such as cracks in the interlayer insulating film.

In addition, in the semiconductor device of the first embodiment, the first interconnects 12 below the pad 1 are linear and have no apex with a great internal angle beyond 180 degrees. Therefore, the influence of stress that will be generated at apexes with great internal angles can be eliminated.

Figure 3:
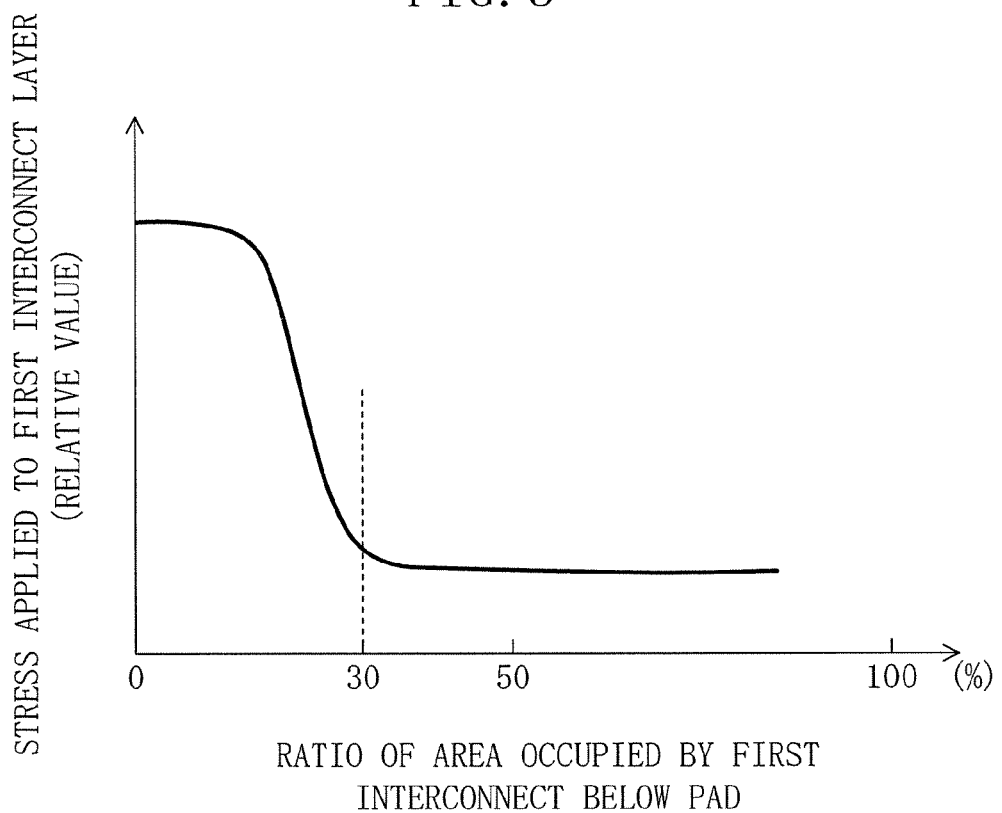
FIG. 3 is a graph showing the relation between the ratio of the area of first interconnects and the stress applied to a first interlayer insulating film in the semiconductor device according to the first embodiment of the present invention.

FIG. 3 shows the relation between the ratio of the area where the first interconnects 12 are formed below the pad 1 and the magnitude of stress applied to the first interconnects 12. In FIG. 3, the abscissa axis represents the ratio of the sum of the areas occupied by the first interconnects 12 below the pad 1 relative to the area of the pad 1, and the ordinate axis represents the relative value of stress applied to the first interconnects 12.

Referring to FIG. 3, when the ratio of the area occupied by the first interconnects 12 falls below 30%, stress applied to the first interconnects 12 sharply rises. Therefore, it is preferable to set the ratio of the area occupied by the first interconnects 12 below the pad 1 at 30% or higher. In consideration of generation of stress by the first interconnects 12 themselves, it is preferable to set the ratio of the area occupied by the first interconnects 12 at about 70% or lower. Such a structure makes it possible to generate almost no stress or strain in the first interconnects 12.

However, if a conductive film with a large area is formed below the pad 1, the conductive film is shrunk during a fabrication process. This becomes a cause of cracks in the interlayer insulating film. Therefore, it is preferable to form the multiple first interconnects 12 to have smaller widths than the pad 1. The widths of the first interconnects 12 and the number thereof should be determined according to the size and shape of the pad 1. For a pad with a standard size, 75 μm×100 μm, it is preferable to form about four to nine first interconnects 12 with width of about 5 to 10 μm. By thus setting the widths of the interconnects at about 10 μm, almost all stress and strain from the first interconnects 12 themselves can be prevented.

In the first embodiment, description has been made of the example in which the first interconnects 12 are formed in only a region below the pad 1 and its vicinity. Alternatively, the first interconnects 12 may extend into other regions. In other said regions not located below the pad 1, they may have branched or bent portions. An actual semiconductor chip has a plurality of pads 1 provided thereon, and it may be designed so that first interconnects running below the pads 1 are connected to each other.

Figure 4:
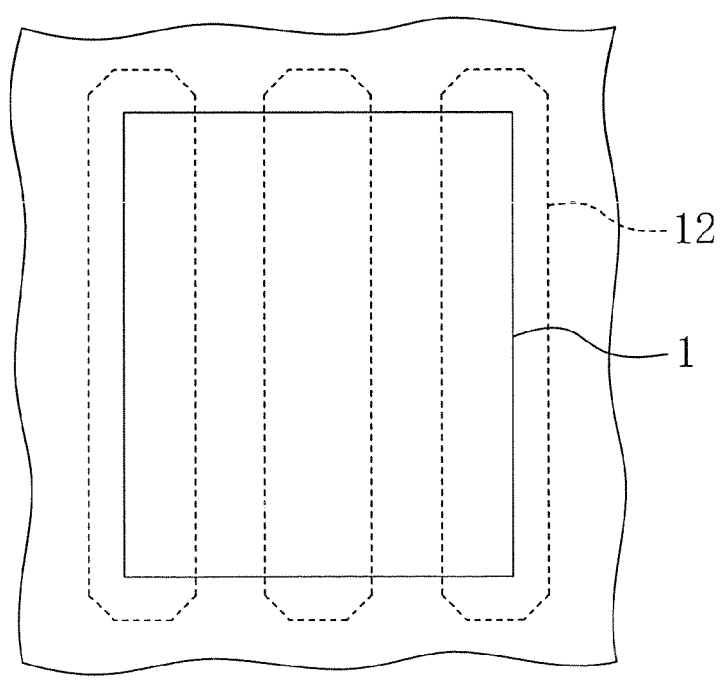
FIG. 4 is a plan view showing another example of the first interconnects in the semiconductor device according to the first embodiment of the present invention.

If the first interconnects 12 are formed only in a region below the pad 1 and its vicinity, the first interconnects 12 may each have a plan shape with corners chamfered as shown in FIG. 4. Such a shape can reduce stress to be generated at the apexes of the first interconnect 12. In this case, the chamfered portion may be formed of a curve, or have the shape formed of a combination of multiple apexes with internal angles more than 90 degrees and less than 180 degrees.

Figure 5:
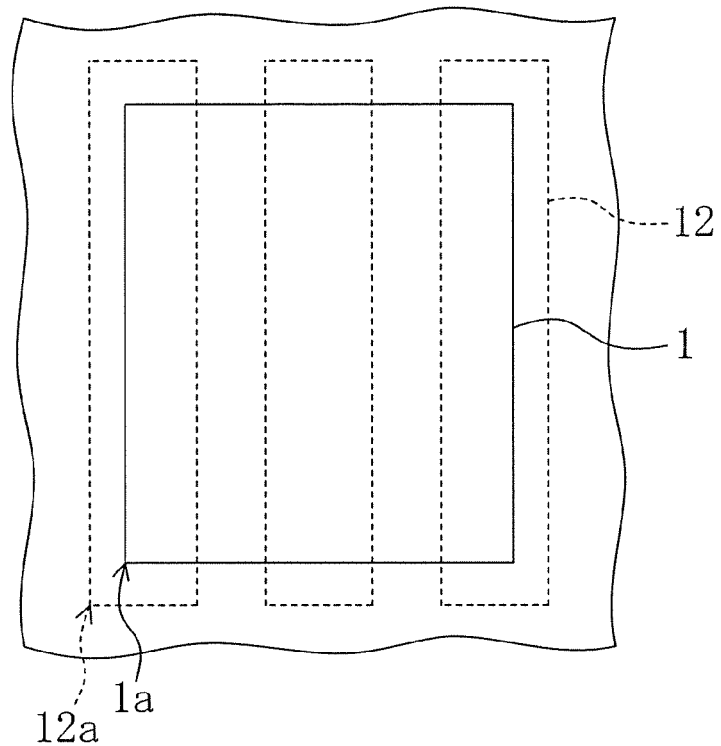
FIG. 5 is a plan view showing another example of the first interconnects in the semiconductor device according to the first embodiment of the present invention.
Figure 6:
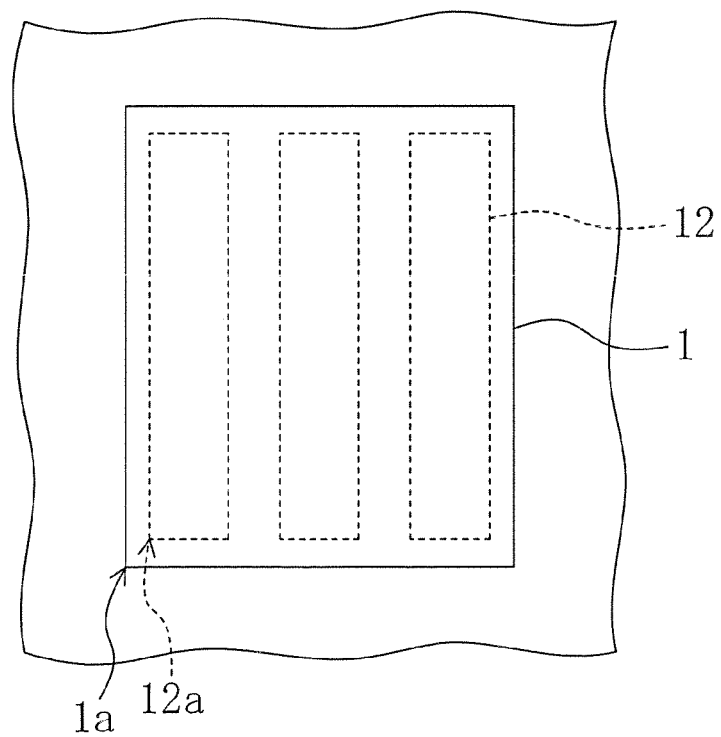
FIG. 6 is a plan view showing another example of the first interconnects in the semiconductor device according to the first embodiment of the present invention.

Further, as shown in FIGS. 5 and 6, the device may be designed so that a side edge 1a of the pad 1 and a side edge 12a of the first interconnect 12 do not overlap each other when viewed from above. Both the side edge 1a of the pad 1 and the side edge 12a of the first interconnect 12 are stress-concentrating portions. However, by displacing the horizontal positions of these stress-concentrating side edges from each other, stress concentration can be avoided. As a result, cracks in the interlayer insulating film can be suppressed.

Figure 7:
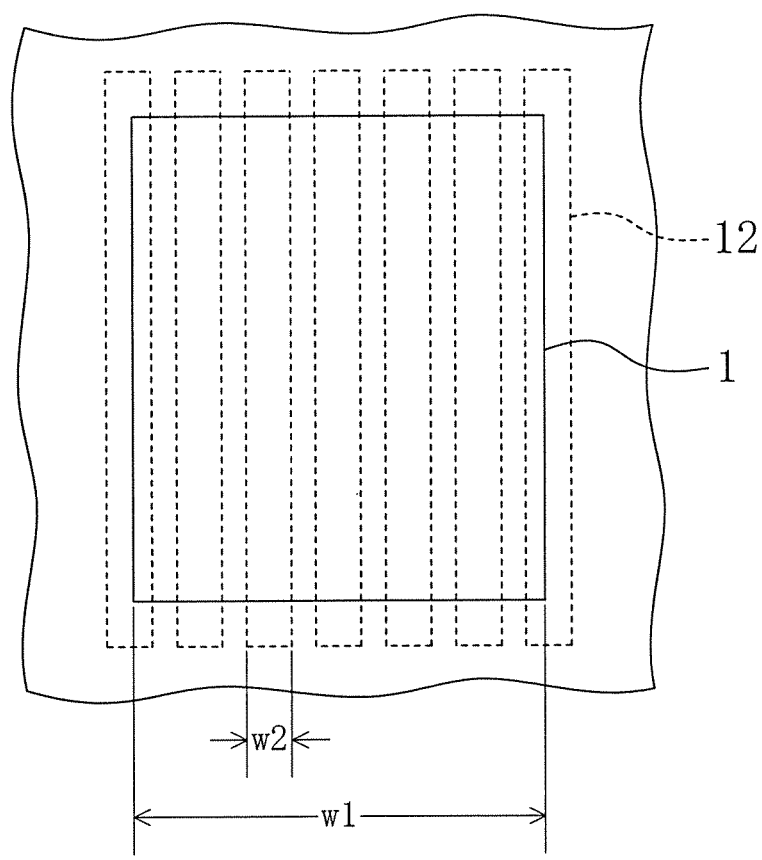
FIG. 7 is a plan view showing an exemplary arrangement of the first interconnects in the semiconductor device according to the first embodiment of the present invention.

FIG. 7 shows an exemplary arrangement of the first interconnects 12. In the case where the first interconnects 12 are arranged in parallel with the longer side of the quadrangular pad 1, the width w2 of each of the first interconnects 12 is set at about a ninth the length w1 of the shorter side of the pad 1, and seven first interconnects 12 are provided below the pad 1. In this case, the first interconnects 12 are formed to occupy about 56% of the portion below the pad 1, which enables sufficient dispersion of stress applied to the pad 1.

First Modification of First Embodiment

Figure 8:
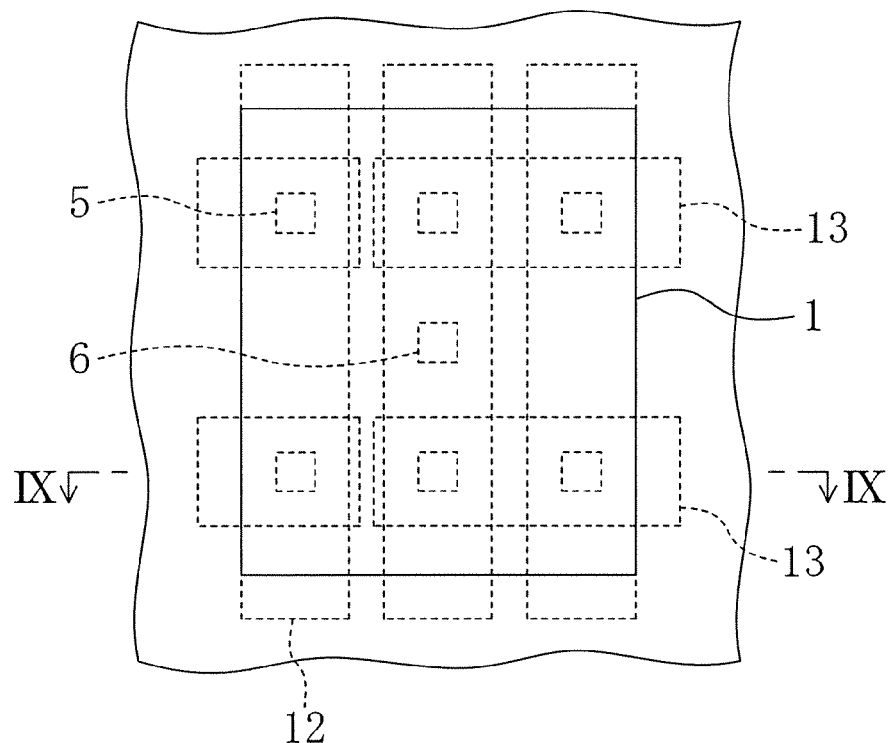
FIG. 8 is a plan view showing a semiconductor device according to a first modification of the first embodiment of the present invention.
Figure 9:
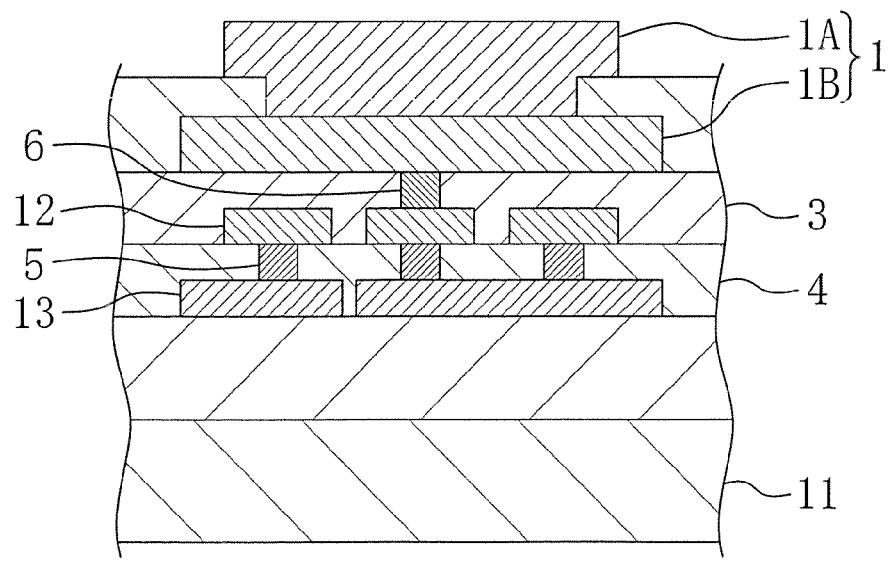
FIG. 9 is a sectional view showing the semiconductor device according to the first modification of the first embodiment of the present invention.

A first modification of the first embodiment will be described below with reference to the accompanying drawings. FIG. 8 shows a plan structure of a pad metal portion of a semiconductor device according to the first modification, and FIG. 9 shows a sectional structure thereof taken along the line IX-IX in FIG. 8. The description of the components shown in FIGS. 8 and 9 that are the same as those shown in FIGS. 1 and 2, respectively, will be omitted by retaining the same reference numerals.

Referring to FIGS. 8 and 9, the semiconductor device of the first modification includes a plurality of via contacts 6 for electrically connecting the first interconnect 12 to the pad 1.

The via contacts 6 enable reinforcement against stress in the cross-sectional direction of the semiconductor substrate 11, and thus enable prevention of physical damages such as cracks into the interlayer insulating film. The via contacts 6 may be disposed anywhere below the pad 1. However, if stress perpendicular to the semiconductor substrate is large, the contacts 6 are preferably disposed at least around the center portion of the pad 1.

In FIG. 8, the via contact 6 is provided to make electrical connection between the pad 1 and one of the plurality of first interconnects 12 formed below the pad 1, which extends below the center portion of the pad 1.

In conducting probing, a probe is generally moved to pass onto the center portion of the pad 1. For example, for a pad metal in a quadrangular plan shape, the probe moves on a line extending on the center portion of the pad metal and in parallel with the longer side of the pad metal. Therefore, to a portion below this line, large stress is applied by the probe. By providing the via contacts 6 along this line to which large stress is applied, stress generated during the probing can be dispersed to inhibit creation of cracks in the interlayer insulating film below the pad metal.

If the direction of movement of the probe is parallel to the shorter side of the pad metal, it is sufficient that the via contact 6 is formed along a line extending on the center portion of the pad metal and in parallel with the shorter side of the pad metal. The pad metal may have a plan shape of square, circle, octagon, or the like. Also in such a case, it is sufficient that the via contact 6 is formed along a line on which the probe moves on the pad metal.

Second Modification of First Embodiment

Figure 10:
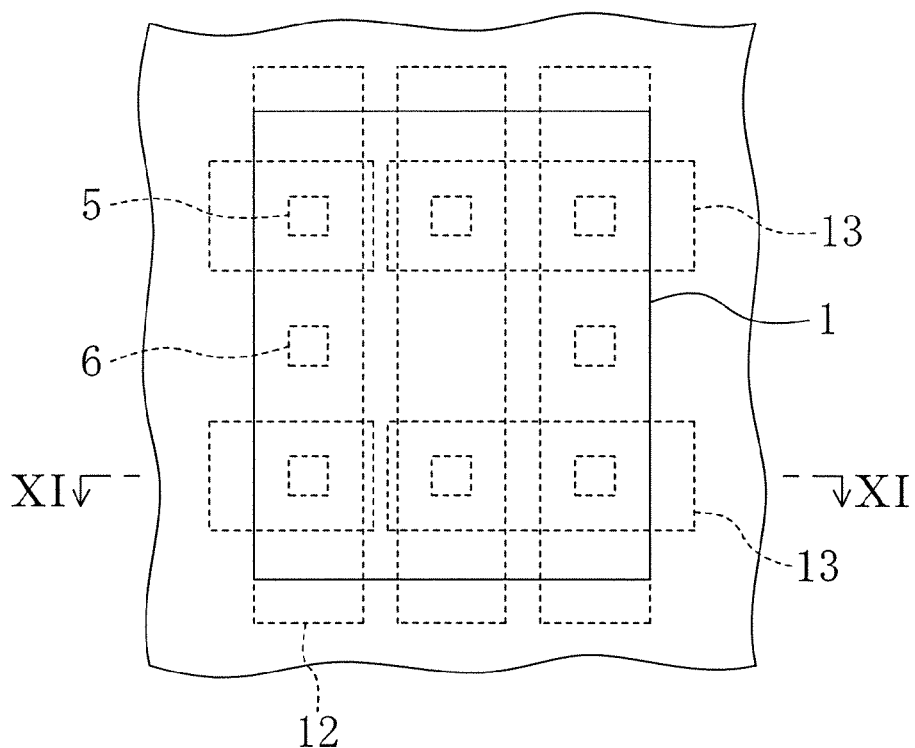
FIG. 10 is a plan view showing a semiconductor device according to a second modification of the first embodiment of the present invention.
Figure 11:
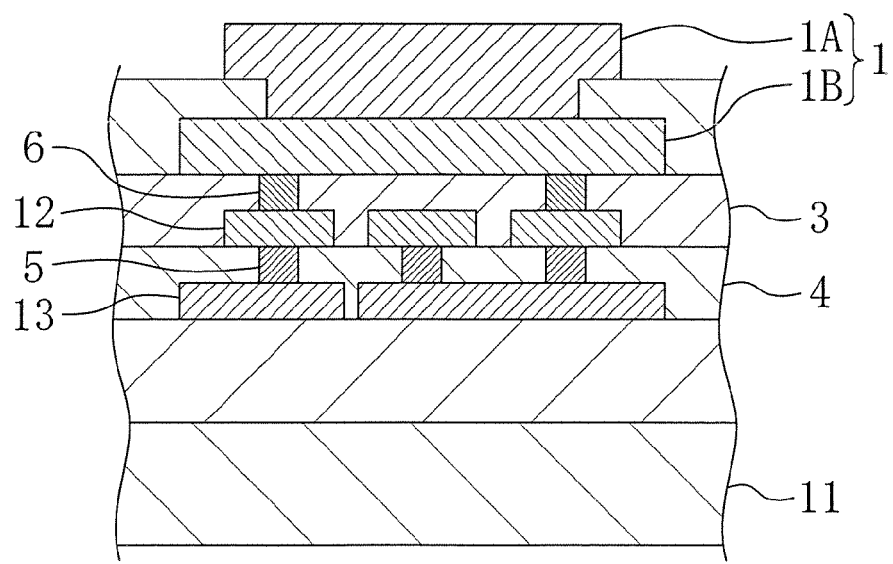
FIG. 11 is a sectional view showing the semiconductor device according to the second modification of the first embodiment of the present invention.

A second modification of the first embodiment will be described below with reference to the accompanying drawings. FIG. 10 shows a plan structure of a pad metal portion of a semiconductor device according to the second modification, and FIG. 11 shows a sectional structure thereof taken along the line XI-XI in FIG. 10. The description of the components shown in FIGS. 10 and 11 that are the same as those shown in FIGS. 1 and 2, respectively, will be omitted by retaining the same reference numerals.

Referring to FIGS. 10 and 11, the semiconductor device of the second modification includes the via contacts 6 to make electrical connection between the pad 1 and ones of the plurality of first interconnects 12 formed below the pad 1, which are located at both edges. By thus providing the via contacts 6 below the perimeter of the pad 1, stress applied to the center portion of the pad 1 can be relieved in the case where stress in the horizontal direction of the semiconductor substrate is large.

Figure 12:
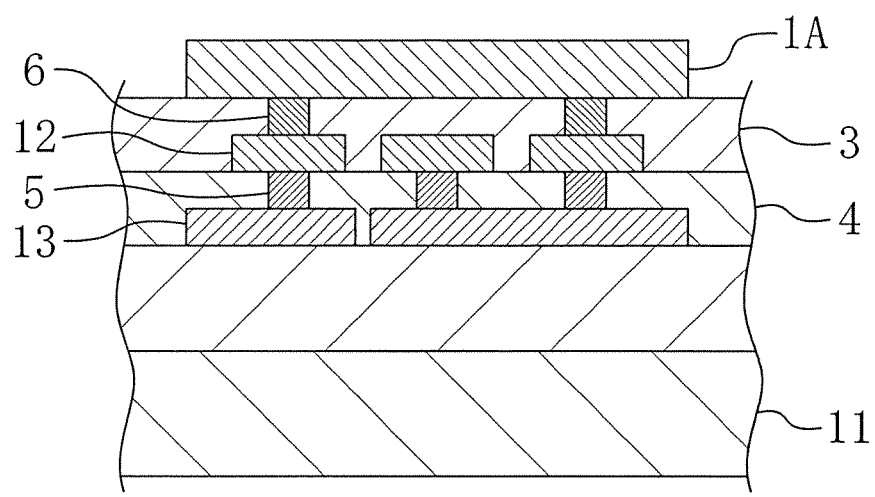
FIG. 12 is a sectional view showing another example of the semiconductor device according to the second modification of the first embodiment of the present invention.

Moreover, if the pad 1 is composed only of the first pad metal 1A as shown in FIG. 12, there is the possibility of producing, on the surface of the pad 1, unevenness resulting from the via contacts 6. If such unevenness is produced on the center portion of the pad 1, it will serve as resistance during bonding or probing to help enlarge stress applied to the interlayer insulating film below the pad 1. However, as shown in FIG. 12, the via contacts 6 are provided to avoid the line on which the probe moves, which prevents unevenness generated on the surface of the pad 1 from serving as resistance during bonding or probing.

In the second modification, description has been made of the example in which the via contact 6 is formed below the both sides of the pad 1, and alternatively the contact 6 may be formed at one side only. Also, description has been made of the example in which the probe moves in parallel with the longer side direction of the quadrangular pad metal. If the probe moves in parallel with the shorter side thereof, it is sufficient that formation of the via contact 6 is avoided on a line extending on the center portion of the pad 1 and in parallel with the shorter side of the pad 1. If the pad 1 has a plan shape of square, circle, octagon, or the like, it is sufficient that the via contact 6 is formed to avoid the line on which the probe moves on the pad metal.

Third Modification of First Embodiment

Figure 13:
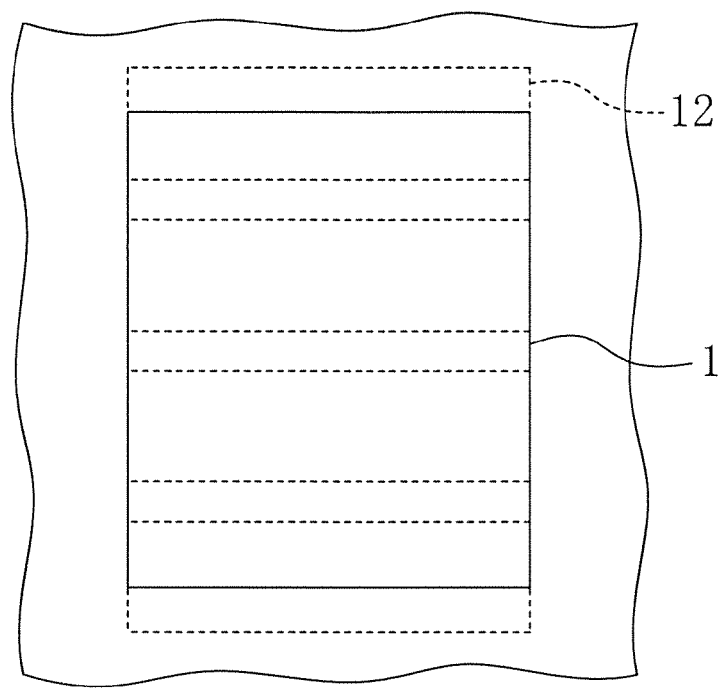
FIG. 13 is a plan view showing a semiconductor device according to a third modification of the first embodiment of the present invention.

A third modification of the first embodiment will be described below with reference to the accompanying drawings. FIG. 13 shows a plan structure of a semiconductor device according to the third modification. The description of the components shown in FIG. 13 that are the same as those shown in FIG. 1 will be omitted by retaining the same reference numerals.

In general, in a probing process, a probe is entered in the parallel direction to the longer side of the pad. If the first interconnect 12 is formed in the orthogonal direction to the longer side of the first pad 1 as shown in FIG. 13, the probing direction coincides with the direction crossing steps formed by the plurality of first interconnects 12. With this, even though the probing weight is reduced, the probe easily comes into contact with the pad metal. Therefore, probing with a low weight can be carried out. This suppresses generation of cracks in the interlayer insulating film.

If a plurality of pads 1 are formed, the first interconnects 12 formed below adjacent pads 1, respectively, can be effectively connected to each other. Therefore, generation of cracks in the interlayer insulating film can be suppressed, and concurrently power supply lines having the same potential or the like can be arranged.

In the third modification, description has been made of the case where application of ultrasonic wave vibration or entry of the probe during bonding is conducted in the parallel direction to the longer side of the pad 1. If, for example, ultrasonic wave vibration is applied in the orthogonal direction to the longer side of the pad 1, it is sufficient that the first interconnect 12 is formed in the parallel direction to the longer side of the pad 1.

In addition, the pad metal may have a plan shape of square, circle, octagon, or the like. In such a case, it is sufficient that the first interconnect 12 is formed in the direction orthogonal to the direction of vibration of ultrasonic wave or entry of the probe.

Fourth Modification of First Embodiment

Figure 14:
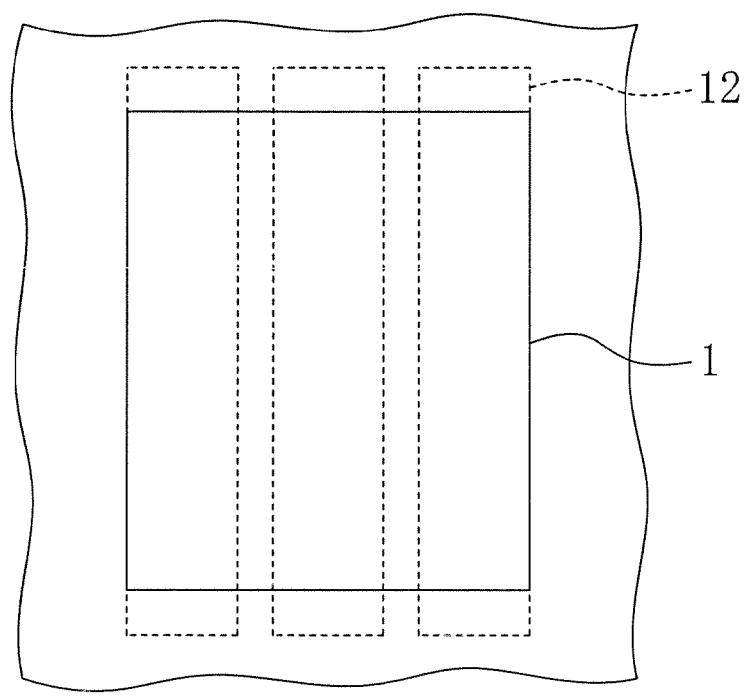
FIG. 14 is a plan view showing a semiconductor device according to a fourth modification of the first embodiment of the present invention.

A fourth modification of the first embodiment will be described below with reference to the accompanying drawings. FIG. 14 shows a plan structure of a semiconductor device according to the fourth modification. The description of the components shown in FIG. 14 that are the same as those shown in FIG. 1 will be omitted by retaining the same reference numerals.

Referring to FIG. 14, in the fourth modification, the first interconnect 12 is formed in the parallel direction to the longer side of the pad 1. Since the probing direction in the fourth modification is parallel to the first interconnect 12, the probe moves on a flat surface. This reduces fraction between the probe and the pad 1, so that generation of cracks can be suppressed in the interlayer insulating film below the pad 1.

In the fourth modification, description has been made of the case where application of ultrasonic wave vibration or entry of the probe during bonding is conducted in the parallel direction to the longer side of the pad 1. If, for example, ultrasonic wave vibration is applied in the orthogonal direction to the longer side of the pad 1, it is sufficient that the first interconnect 12 is formed in the orthogonal direction to the longer side of the pad 1.

In addition, the pad metal may have a plan shape of square, circle, octagon, or the like. In such a case, it is sufficient that the first interconnect 12 is formed in the direction parallel to the direction of vibration of ultrasonic wave or entry of the probe.

Fifth Modification of First Embodiment

Figure 15:
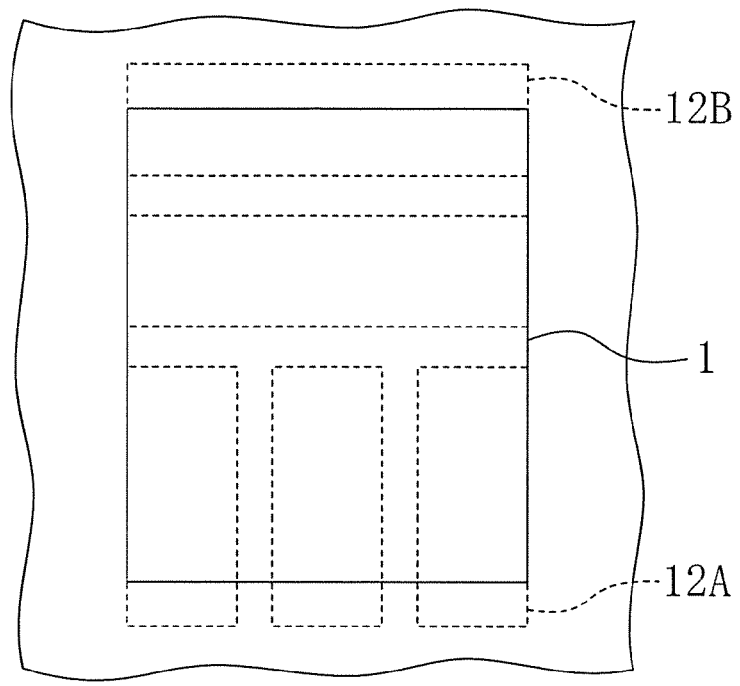
FIG. 15 is a plan view showing a semiconductor device according to a fifth modification of the first embodiment of the present invention.

A fifth modification of the first embodiment will be described below with reference to the accompanying drawings. FIG. 15 shows a plan structure of a semiconductor device according to the fifth modification. The description of the components shown in FIG. 15 that are the same as those shown in FIG. 1 will be omitted by retaining the same reference numerals.

Referring to FIG. 15, in the fifth modification, the device includes both a first interconnect 12A formed in the parallel direction to the longer side of the pad 1 and a first interconnect 12B formed in the orthogonal direction to the longer side of the pad 1.

As shown above, by arranging the first interconnects 12 in the two directions, stress does not concentrate in one direction but can be dispersed in the two directions. This effectively relieves stress applied to the interlayer insulating film below the pad 1 during bonding and probing.

The pad metal may have a plan shape of square, circle, octagon, or the like. In such a case, it is sufficient that some of the first interconnects 12 are formed in the direction parallel to the direction of vibration of ultrasonic wave or entry of the probe and the others are formed in the direction orthogonal thereto.

Sixth Modification of First Embodiment

Figure 16:
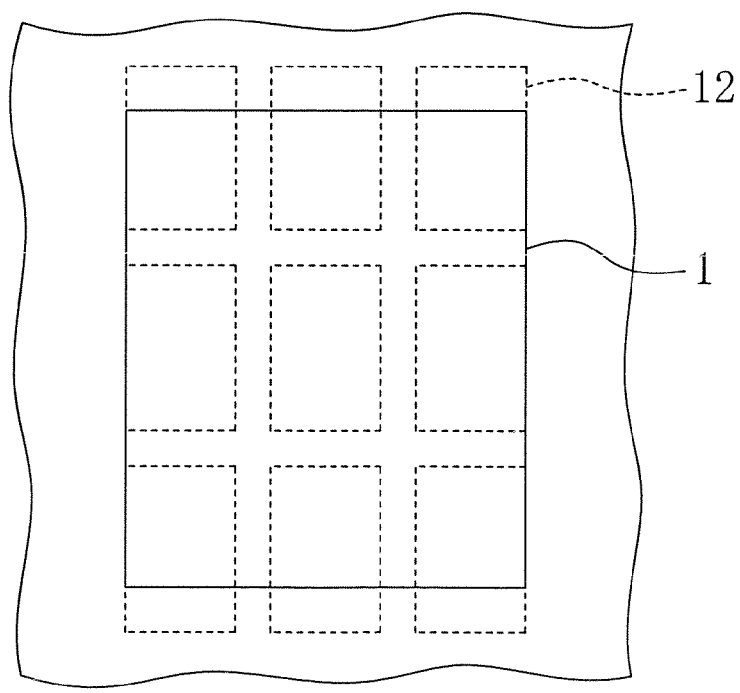
FIG. 16 is a plan view showing a semiconductor device according to a sixth modification of the first embodiment of the present invention.

A sixth modification of the first embodiment will be described with reference to the accompanying drawings. FIG. 16 shows a plan structure of a semiconductor device according to the sixth modification. The description of the components shown in FIG. 16 that are the same as those shown in FIG. 1 will be omitted by retaining the same reference numerals.

Referring to FIG. 16, in the sixth modification, the first interconnects 12 are formed in the shapes like multiple islands (dots) located below the pad 1. By forming the first interconnects 12 in such insular shapes, stress applied to the interlayer insulating film can be dispersed more effectively to suppress generation of cracks in the interlayer insulating film.

Seventh Modification of First Embodiment

Figure 17:
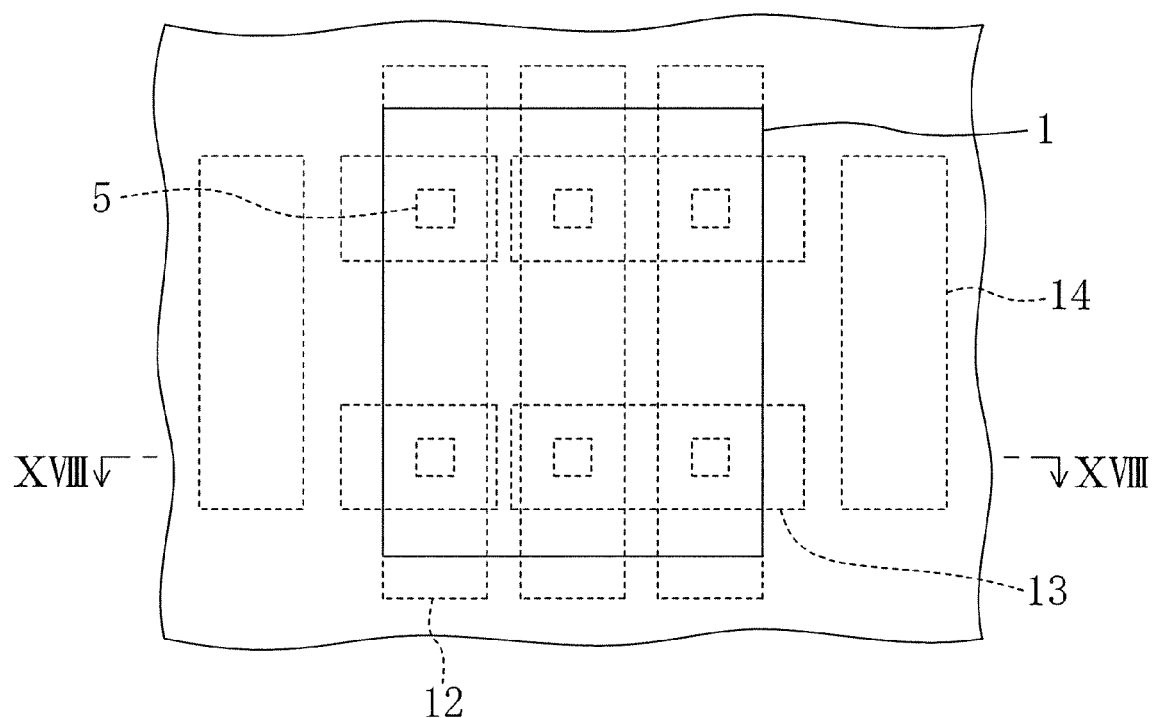
FIG. 17 is a plan view showing a semiconductor device according to a seventh modification of the first embodiment of the present invention.
Figure 18:
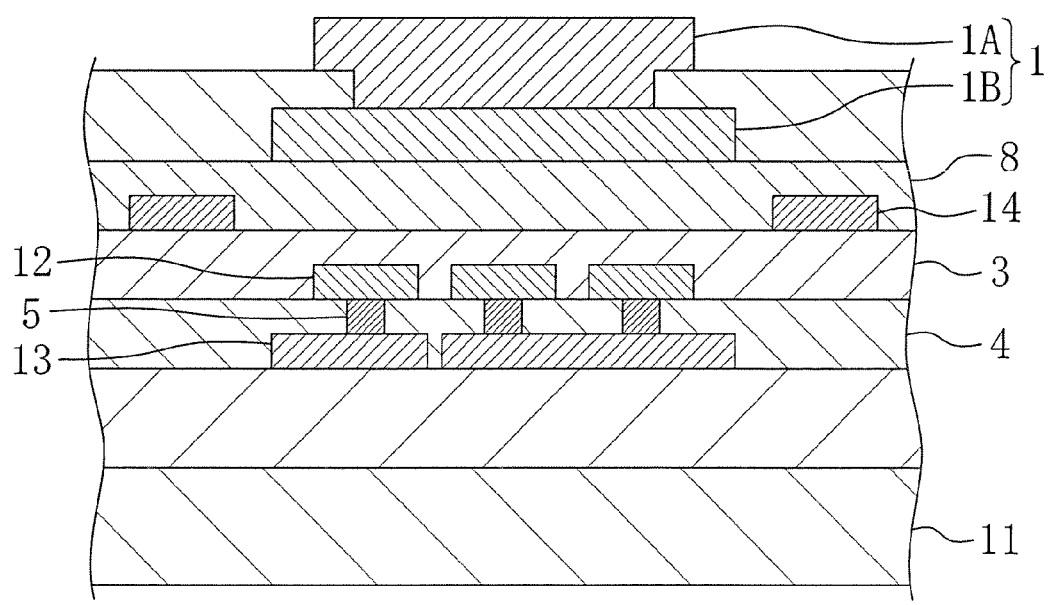
FIG. 18 is a sectional view showing the semiconductor device according to the seventh modification of the first embodiment of the present invention.

A seventh modification of the first embodiment will be described below with reference to the accompanying drawings. FIG. 17 shows a plan structure of a pad metal portion of a semiconductor device according to the seventh modification, and FIG. 18 shows a sectional structure thereof taken along the line XVIII-XVIII in FIG. 17. The description of the components shown in FIGS. 17 and 18 that are the same as those shown in FIGS. 1 and 2, respectively, will be omitted by retaining the same reference numerals.

Referring to FIGS. 17 and 18, the semiconductor device of the seventh modification includes a third interlayer insulating film 8 between the pad 1 and the first interconnect 12. Further, a third interconnect 14 is buried in the third interlayer insulating film 8, and a third interconnect 14 is formed to avoid a region below the pad 1.

Figure 24:
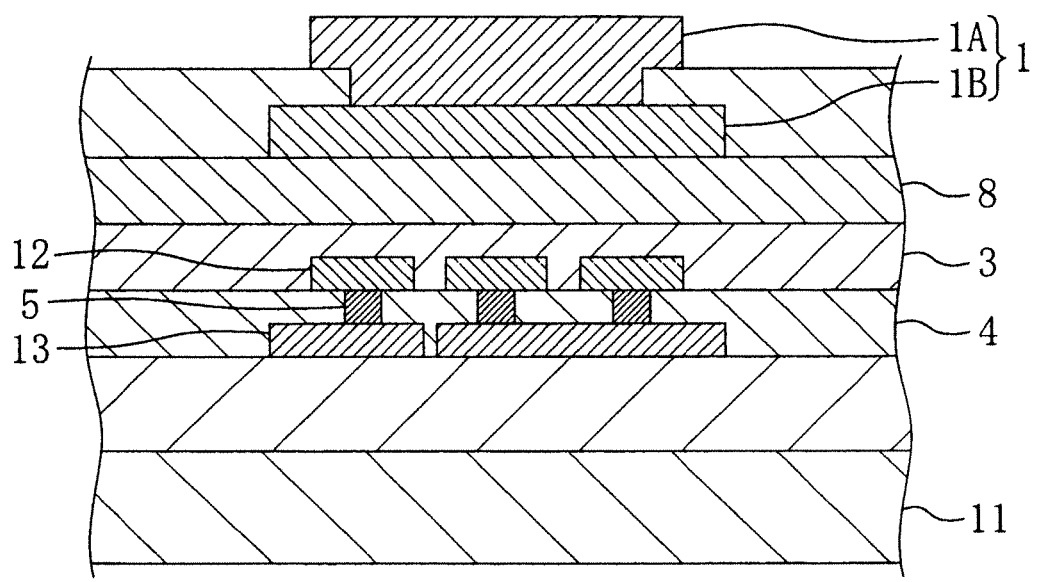
FIG. 24 is a sectional view showing the semiconductor device according to another modification of the first embodiment of the present invention.

With the seventh modification, the interlayer insulating film located between the pad 1 and the first interconnect 12 can have a sufficient thickness. Therefore, stress concentration can be avoided to suppress generation of cracks in the interlayer insulating film. Note that multiple layers of interlayer insulating films may be provided between the pad 1 and the first interconnect 12. The interlayer insulating film 8 does not necessarily have to be formed with an interconnect as shown in FIG. 24.

Second Embodiment

Figure 19:
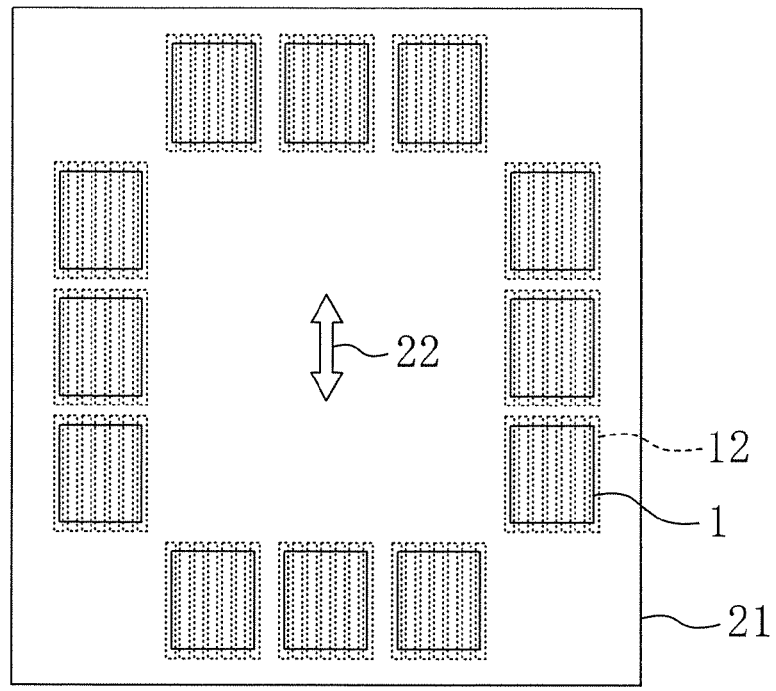
FIG. 19 is a plan view showing a semiconductor device according to a second embodiment of the present invention.

Hereinafter, a second embodiment of the present invention will be described with reference to the accompanying drawings. FIG. 19 shows a plan structure of a semiconductor device according to the second embodiment. The description of the components shown in FIG. 19 that are the same as those shown in FIG. 1 will be omitted by retaining the same reference numerals.

Referring to FIG. 19, on the top surface of a semiconductor chip 21, a plurality of pads 1 are circularly formed along the perimeter of the semiconductor chip 21. A plurality of first interconnects 12 are formed below each of the pads 1. The number of pads 1 and the number of first interconnects 12 that are shown in this figure are used as an example, and may be changed as appropriate.

The direction of vibration of ultrasonic wave applied in conducting wire bonding onto the pad is only one direction for all of the pads 1 because of constraints of a bonding machine. The second embodiment illustrates an exemplary case in which ultrasonic wave vibrating in the vibration direction 22 is applied to all of the pads 1. All of the first interconnects 12 provided below the pads 1 are formed to extend in parallel with the vibration direction 22 of ultrasonic wave applied by the bonding machine.

As shown above, by forming the first interconnects 12 to extend in parallel with the vibration direction 22 of ultrasonic wave applied to the pads 1, stress applied to the portion below the pad 1 can be dispersed to suppress generation of cracks in the interlayer insulating film.

Third Embodiment

Figure 20:
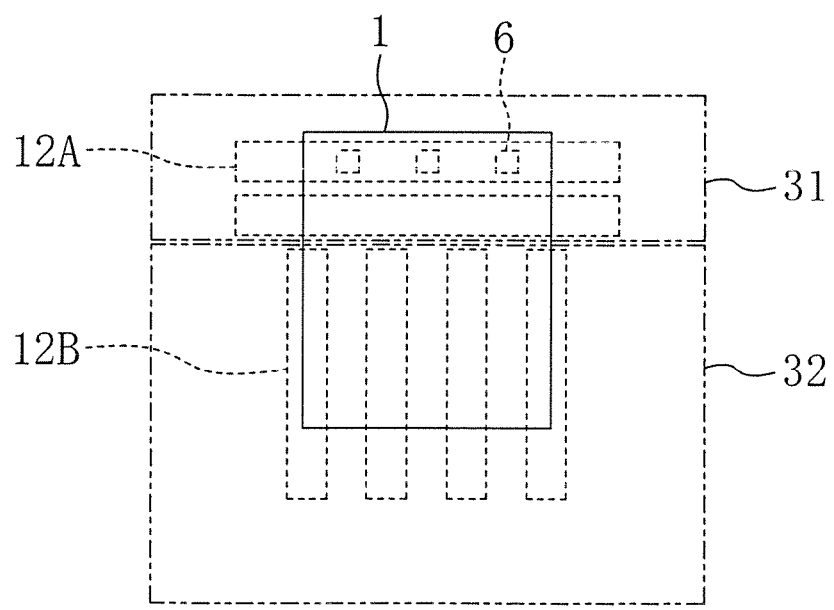
FIG. 20 is a plan view showing a semiconductor device according to a third embodiment of the present invention.
Figure 21:
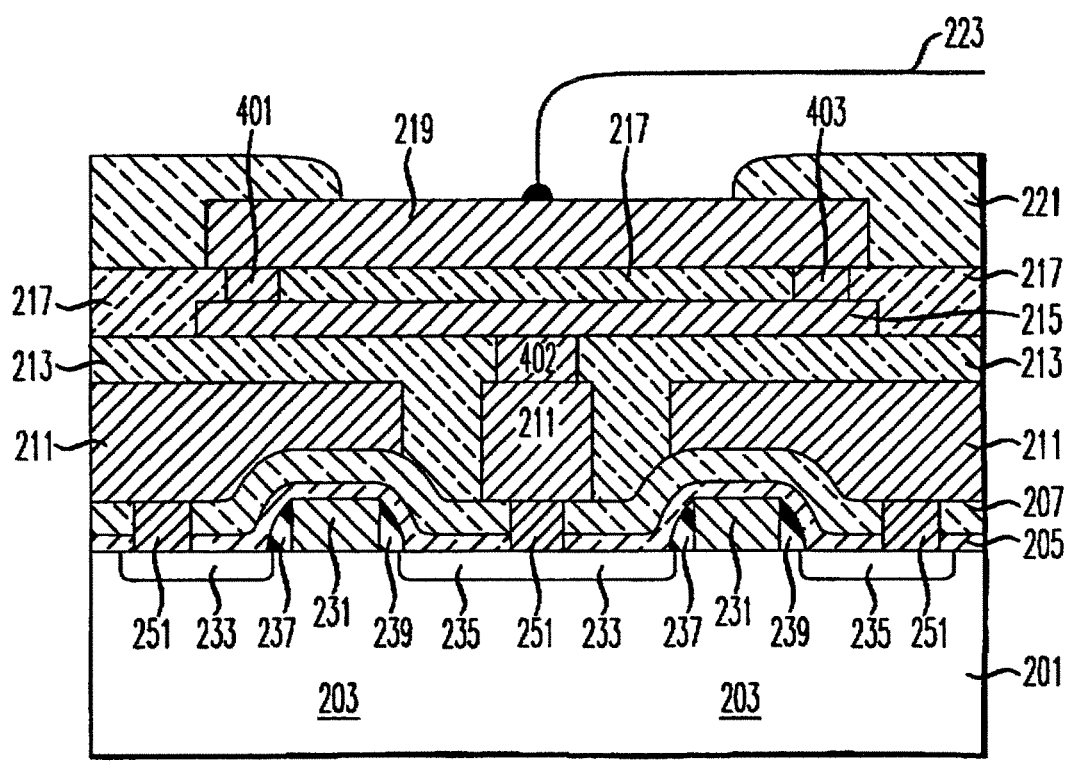
FIG. 21 is a sectional view showing a semiconductor device according to a conventional example.
Figure 22:
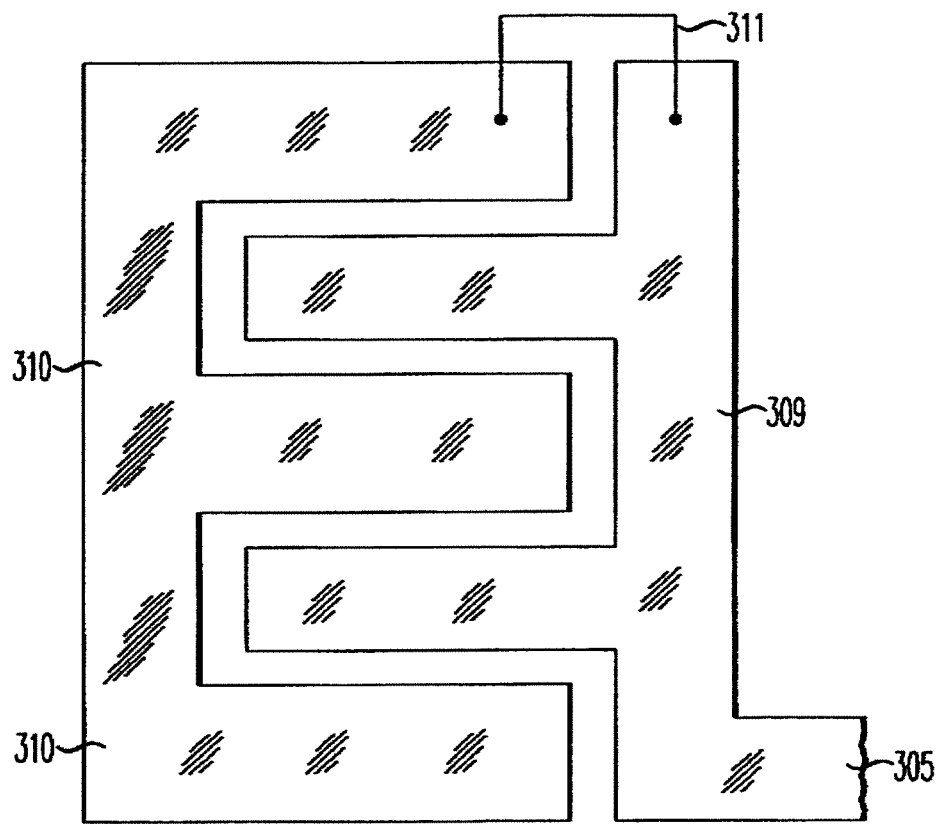
FIG. 22 is a plan view showing main parts of the semiconductor device according to the conventional example.

Hereinafter, a third embodiment of the present invention will be described with reference to the accompanying drawings. FIG. 20 shows a plan structure of a semiconductor device according to the third embodiment. The description of the components shown in FIG. 20 that are the same as those shown in FIG. 1 will be omitted by retaining the same reference numerals.

In the third embodiment, the pad 1 in a rectangular plan shape is formed to extend across an input/output circuit region 31 and a logic circuit region 32 of a semiconductor chip. Since the circuit to be connected to the pad 1 is an input/output circuit, it is sufficient that the pad 1 and the first interconnect 12A provided in the input/output circuit region 31 are connected to each other by the via contact 6. With this structure, unevenness caused by the via contact 6 around the center portion of the pad is eliminated. Moreover, by providing the pad 1 to extend onto the logic circuit region 32, dead space created due to the pad 1 can be eliminated to make the size of the semiconductor chip smaller.

In the third embodiment, the first interconnects 12A and 12B provided in the input/output circuit region 31 and the logic circuit region 32, respectively, are arranged to extend in different directions. This structure can disperse stress applied to the pad 1 to relieve stress applied to the interlayer insulating film below the pad 1 during bonding and probing.

Furthermore, in order to avoid causing stress-induced damages to the logic circuit region 32, use of a probe capable of applying low stress is preferred. In this case, preferably, the first interconnect 12B in the logic circuit region 32 is provided along the orthogonal direction to the direction of movement of the probe to reduce the electric resistance between the probe and the pad 1.

Figure 23:
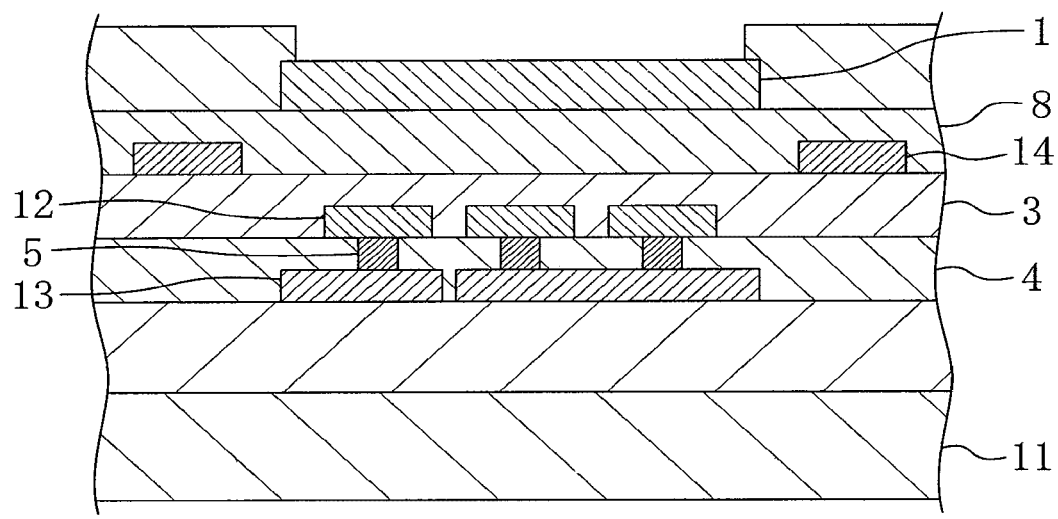
FIG. 23 is a sectional view showing the semiconductor device according to an eighth modification of the first embodiment of the present invention.

In the embodiments and the modifications shown above, description has made of the case where the pad 1 basically employs two-layered structure. Alternatively, it may be composed of a single layer or a structure made by stacking three or more layers as shown in FIG. 23. A contact via may be further provided which connects the first interconnect 12 to a source or a drain of a transistor located in a lowermost layer.

As described above, the present invention can advantageously provide a highly reliable semiconductor device which protects elements from stress generated in a bonding process and a probing process and which eliminates cracks to be created in an insulating film lying below a bonding pad, so that the semiconductor device of the present invention is useful for a semiconductor device and the like including pads.

What is claimed is:

1. A semiconductor device comprising:
   a semiconductor substrate;
   a first interlayer insulating film disposed over the semiconductor substrate;
   a pad formed above the first interlayer insulating film;
   a plurality of first interconnects which are formed in the first interlayer insulating film and are spaced apart from one another, the plurality of first interconnects being disposed directly below the pad;
   a second interlayer insulating film formed between the substrate and the first interlayer insulating film; and
   a plurality of second interconnects formed in the second interlayer insulating film, wherein:
   only one of the plurality of first interconnects disposed directly below the pad is physically connected to the pad, where an upper surface of the only one of the plurality of first interconnects is physically connected to the pad by a first via plug that is disposed directly below the pad and is disposed on the upper surface,
   the only one of the plurality of first interconnects is connected to one of the plurality of second interconnects by a second via plug,
   the second via plug is disposed directly below the first via plug,
   the only one of the plurality of first interconnects extends along a first direction in a plan view,
   the one of the plurality of second interconnects extends along a second direction orthogonal to the first direction in a plan view, and
   a longer side of the only one of the plurality of first interconnects is disposed along the first direction, and a longer side of the one of the plurality of second interconnects is disposed along the second direction.

2. The semiconductor device of claim 1, wherein the pad has a contact portion which comes into contact with a probe, and the first via plug is formed directly below the contact portion.

3. The semiconductor device of claim 1, wherein the first via plug is formed to come into contact with a center portion of the pad.

4. The semiconductor device of claim 1, wherein:
the semiconductor device includes a plurality of via plugs including the first via plug in the first interlayer insulating film, and
the plurality of via plugs are disposed on the only one of the first interconnects along the first direction.

5. The semiconductor device of claim 1, wherein:
each of the plurality of first interconnects has a width and a length, the length being larger than the width,
the pad has a width and a length, the length being larger than the width, and
the width of each of the plurality of first interconnects is shorter than the width of the pad.

6. The semiconductor device of claim 1, wherein directly below the pad, an area occupied by the plurality of first interconnects directly below the pad is 30% or more of an area of the pad, in a plan view.

7. The semiconductor device of claim 1, wherein the plurality of first interconnects each extend linearly directly below the pad.

8. The semiconductor device of claim 7, wherein the plurality of first interconnects extend in the same direction.

9. The semiconductor device of claim 8,
wherein the pad has a rectangular plan shape, and
a longer edge of the pad extends along the second direction.

10. The semiconductor device of claim 8,
wherein the pad has a rectangular plan shape, and
a longer edge of the pad extends along the first direction.

11. The semiconductor device of claim 1, wherein at least two of the plurality of first interconnects are electrically connected to each other by a connection interconnect disposed in an interlayer insulating film different from the first interlayer insulating film.

12. The semiconductor device of claim 1, wherein directly below the pad, at least two of the plurality of first interconnects are electrically connected to each other by the one of the plurality of second interconnects.

13. The semiconductor device of claim 1, wherein some of the plurality of first interconnects serve as shielding signal lines for providing electrical shielding between the pad and the plurality of second interconnects.

14. The semiconductor device of claim 13, wherein the shielding signal lines are grounding signal lines or power-source signal lines.

15. The semiconductor device of claim 1, wherein the pad has a square plan shape.

16. The semiconductor device of claim 1, wherein:
the pad includes a first pad metal, and
in a cross section view of the pad, a top width of the first pad metal is longer than a bottom width of the first pad metal.

17. The semiconductor device of claim 16, wherein the pad further includes a second pad metal disposed between the first pad metal and the first via plug, and
in a cross section view of the pad, the top width of the first pad metal is shorter than a top width of the second pad metal.

18. The semiconductor device of claim 1, wherein the pad is formed of a single layer film.

19. The semiconductor device of claim 1, wherein the pad includes multiple layers of metal films.

20. The semiconductor device of claim 1, wherein the first interlayer insulating film is disposed as the uppermost film of interlayer insulating films directly below the pad.

21. The semiconductor device of claim 1, wherein the plurality of first interconnects each have a plan shape with corners chamfered.

22. The semiconductor device of claim 1, wherein a side of one of the plurality of first interconnects nearest to an edge of the pad is displaced from a side of the pad.

23. The semiconductor device of claim 1, wherein outside the pad in a plan view, the plurality of first interconnects have branched portions.

24. The semiconductor device of claim 1, wherein outside the pad, the plurality of first interconnects have bent portions.

25. The semiconductor device of claim 1, wherein the plurality of first interconnects extend to a region which is directly below another pad adjacent to the pad in a plan view.

26. The semiconductor device of claim 1, wherein:
the one of the plurality of second interconnects extends to a region directly below an adjacent first interconnect which is disposed adjacent to the only one of the plurality of first interconnects, and
an edge of the one of the plurality of second interconnects disposed the adjacent first interconnect is disposed not directly below another first interconnect.

27. The semiconductor device of claim 1, wherein none of the plurality of first interconnects have a bent portion in a plan view directly below the pad.

28. The semiconductor device of claim 1, wherein none of the plurality of second interconnects have a bent portion in a plan view directly below the pad.

29. The semiconductor device of claim 1, wherein
the plurality of first interconnects are closest interconnects to the pad in a cross section directly below the pad.

30. A semiconductor device comprising:
a semiconductor substrate;
a first interlayer insulating film disposed over the semiconductor substrate;
a pad formed above the first interlayer insulating film;
a plurality of first interconnects which are formed in the first interlayer insulating film and are spaced apart from one another, the plurality of first interconnects being disposed directly below the pad;
a second interlayer insulating film formed between the substrate and the first interlayer insulating film; and
a plurality of second interconnects formed in the second interlayer insulating film, wherein:
the plurality of first interconnects are closest interconnects to the pad in a cross section directly below the pad,
only one of the plurality of first interconnects disposed directly below the pad is physically connected to the pad, where an upper surface of the only one of the plurality of first interconnects is physically connected to the pad in the first interlayer insulating film directly below the pad,
the only one of the plurality of first interconnects is connected to one of the plurality of second interconnects by a via plug directly below the pad,
the only one of the plurality of first interconnects extends along a first direction in a plan view,
the one of the plurality of second interconnects extends along a second direction orthogonal to the first direction in a plan view, and
a longer side of the only one of the plurality of first interconnects is disposed along the first direction, and a longer side of the one of the plurality of second interconnects is disposed along the second direction.

* * * * *